United States Patent [19]

Mikoshiba et al.

[11] Patent Number: 5,091,210
[45] Date of Patent: Feb. 25, 1992

[54] PLASMA CVD OF ALUMINUM FILMS

[75] Inventors: Nobuo Mikoshiba; Kazuo Tsubouchi; Kazuya Masu, all of Sendai, Japan

[73] Assignee: Canon Kabushiki Kaisha, Tokyo, Japan

[21] Appl. No.: 584,637

[22] Filed: Sep. 19, 1990

[51] Int. Cl.$^5$ .......................... B05D 3/06; B05D 5/12
[52] U.S. Cl. ........................................ 427/39; 427/38; 427/124; 427/123; 427/126.1; 427/255.1; 427/255.2; 427/314; 427/250
[58] Field of Search .................. 427/39, 38, 123, 124, 427/250, 248.1, 255.1, 255.2, 314, 126.1; 118/723

[56] References Cited

U.S. PATENT DOCUMENTS

| | | | |
|---|---|---|---|
| 3,338,209 | 8/1967 | Bhola | 118/715 |
| 4,716,050 | 12/1987 | Green et al. | 427/99 |

FOREIGN PATENT DOCUMENTS

| | | |
|---|---|---|
| 0183254 | 11/1985 | European Pat. Off. |
| 59-13344 | 1/1984 | Japan . |
| 62-74095 | 4/1987 | Japan . |
| 63-6832 | 1/1988 | Japan . |
| 63-33569 | 2/1988 | Japan . |
| 63-47364 | 2/1988 | Japan . |
| 1-252776 | 10/1989 | Japan . |
| 2-170419 | 7/1990 | Japan . |
| 2-185026 | 7/1990 | Japan . |

OTHER PUBLICATIONS

R. A. Levy et al., "Characterization of LPCVD Aluminum for VLSI Processing", Journal of the Electrochemical Society, vol. 131, No. 9, pp. 2175-2182, Sep. 1984.
R. Bhat et al., "The Growth and Characterization of AlGaAs Using Dimethyl Aluminum Hydride", Journal of Crystal Growth, vol. 77, pp. 7-10 (1986).
M. Hanabusa et al., "Photochemical Vapor Deposition of Aluminum Thin Films Using Dimethylaluminum Hydride", Japanese Journal of Applied Physics, vol. 27, No. 8, pp. L1392-L1394, Aug. 1988.
A. Sekiguchi et al., "Gas-Temperature-Controlled (GTC) CVD of Aluminum and Aluminum-Silicon Alloy Film for VLSI Processing", Japanese Journal of Applied Physics, vol. 27, No. 11, pp. L2134-L2136, Nov. 1988.
K. Masu et al., "Aluminum Deposition From Weekly--Excited Metalorganic Source by Hybrid-Excitation CVD", Extended Abstracts of the 20th (1988 International) Conference on Solid State Devices and Materials, pp. 573-576, Tokyo 1988.
D. R. Biswas et al., "Vapor Phase Deposition of Aluminum Film on Quartz Substrate", Journal of the Electrochemical Society, vol. 130, No. 1, pp. 234-236, Jan. 1983.
T. Kato et al., "Chemical Vapor Deposition of Aluminum Enhanced by Magnetron-Plasma", Journal of the Electrochemical Society, vol. 135, No. 2, pp. 455-459, Feb. 1988.

Primary Examiner—Michael Lusignan
Assistant Examiner—Roy V. King
Attorney, Agent, or Firm—Fitzpatrick, Cella, Harper & Scinto

[57] ABSTRACT

A deposited film formation method which forms an aluminum film by use of the plasma CVD method, wherein a substrate having an electron donative surface (A) and a non-electron donative surface (B) is arranged in a space for deposited film formation having a portion which is increased in cross-sectional area toward said substrate is arranged, and a gas of trimethylaluminum and hydrogen gas are introduced into said space for deposited film formation to deposit an aluminum film selectively on said electron donative surface (A).

A deposited film formation method which forms an aluminum film by use of the plasma CVD method, comprising:
(a) the step of arranging a substrate having an electron donative surface (a) and a non-electron donative surface (B) in a space for deposited film formation equipped with a reverse flow preventive means into plasma, and
(b) the step of introducing a gas of trimethylaluminum and hydrogen gas into said space for deposited film formation, said aluminum film being selectively formed on said electron donative surface (A).

19 Claims, 2 Drawing Sheets

PLASMA CVD OF ALUMINUM FILMS

BACKGROUND OF THE INVENTION

1. Field of the Invention

This invention relates to a deposited film formation method, particularly to a formation method of Al or Al-Si deposited film which can be preferably applied to wiring of a semiconductor integrated circuit device, etc.

2. Related Background Art

In the prior art, in electronic devices or integrated circuits using semiconductors, for electrodes and wiring, aluminum (Al) or Al-Si, etc. have been primarily used. Here, Al has many advantages in that it is inexpensive and high in electroconductivity, that it can be also be internally chemically protected because a dense oxidized film can be formed on the surface, and that it has good adhesion to Si, etc.

The integration degree of the integrated circuit such as LSI, etc. is increased, and fine formation of wiring and multi-layer wiring, etc. have been particularly required in recent years. For this reason, there is an increasing heavy demand to meet those requirements which have not been found to date for Al or Al-Si wiring in the prior art. With finer dimensional formation by increased integration degree of the integrated circuit, the surface of LSI, etc. is subject to excessive unevenness due to oxidation, diffusion, thin film deposition, etching, etc.

Electrodes or wiring metal must be deposited on the surface with a stepped difference, or deposited in a via-hole which is fine in diameter and deep. In 4 Mbit or 16 Mbit DRAM (dynamic RAM), etc., the aspect ratio (via-hole depth/via-hole diameter) of via-hole in which a metal such as, Al-Si, etc. is deposited is 1.0 or more, and the via-hole diameter itself also becomes 1 $\mu$m or less. Therefore, even for a via-hole with large aspect ratio, a technique which can surely deposit a metal such as Al, Al-Si, etc. is required.

Particularly, for performing sure electrical connection to the device under insulating film such as $SiO_2$, etc., rather than film formation, Al or Al-Si is required to be deposited so as to be embedded in only the via-hole of the device. For such purpose, a method of depositing Al or Al-Si on Si or metal surface and not depositing it on an insulating film such as $SiO_2$, etc. is required.

Such selective deposition or selective growth cannot be realized by the sputtering method which has been used in the prior art. Since the sputtering method is a physical deposition method based on flying of the particles sputtered from the target in vacuum, the film thickness at the stepped portion or the side wall of insulating film is liable to become extremely thin, even resulting in wire breaking in an extreme case. Additionally, nonuniformity of the film thickness and wire breaking will markedly lower reliability and yield of LSI.

Accordingly, there has been developed the bias sputtering method in which a bias is applied to a substrate and deposition is performed so as to only embed Al or Al-Si in the via-hole by utilizing the sputter etching action and the deposition action on the substrate surface. However, since a bias voltage of some 100 V or higher is applied to the substrate, deleterious influence on the device may sometimes occur because of charged particle damaging such as change in threshold value of MOS-FET, etc. Also, because of coexistence of both etching action and deposition, there is the problem that the deposition rate cannot be essentially improved.

In order to solve the problems as described above, various types of CVD (Chemical Vapor Deposition) methods have been proposed. In these methods, chemical reaction of the starting gas is utilized in some form. In plasma CVD or optical CVD, decomposition of the starting gas occurs in gas phase, and the active species formed there further reacts on the substrate to form a film. In these CVD methods, surface coverage over unevenness on the substrate surface is good. However, since an organometallic compound having alkyl group bonded to Al atom is generally used as the starting gas, there is the problem that the carbon atoms contained in the starting gas molecule are incorporated into the film. Also, particularly in plasma CVD, the problem remained that damage by charged particles (so called plasma damage) may occur at some time as in the case of the sputtering method.

In contrast, the thermal CVD method has good coverage over unevenness such as stepped difference of the surface, because the film grows according to the surface reaction on the surface of substrate. Also, deposition within via-hole can be expected to readily occur. Further, due to good coverage, wire breaking at the stepped difference can also be avoided.

For example, as the method for forming Al film by the thermal CVD, there may be employed the method in which an organic aluminum is transported onto a heated substrate and the gas molecules are pyrolyzed on the substrate to form a film. For example, in an example shown in Journal of Electrochemical Society, Vol. 131, p. 2175 (1984), by use of triisobutyl aluminum (i-$C_4H_9)_3$Al (TIBA) as organic aluminum gas, film formation is effected at a film formation temperature of 260° C. and a reaction tube pressure of 0.5 torr to form a film of 3.4 $\mu\Omega$·cm.

However, when TIBA is employed, no continuous film can be obtained unless such pre-treatments as flowing of $TiCl_4$ before film formation, activation of the substrate surface, formation of nucleus, etc. are applied. Also, including the case using $TiCl_4$, generally there is involved the problem that surface selectivity is inferior when TIBA is employed.

Japanese Laid-open Patent Application No. Sho-63-33569 describes a method of forming a film by using no $TiCl_4$, but using in place thereof organic aluminum and heating it in the vicinity of the substrate. According to this method, Al can be deposited selectively only on the metal or semiconductor surface from which the naturally oxidized film has been removed.

However, in this case, it is clearly described that the step of removing the naturally oxidized film on the substrate surface is necessary before introduction of TIBA. Also, it is described that, since TIBA can be used alone, no carrier gas is required to be used, but Ar gas may be also used as the carrier gas. However, the reaction of TIBA with another gas (e.g. $H_2$) is not contemplated at all, and there is no description of use of $H_2$ as the carrier gas. Also, in addition to TIBA, trimethyl aluminum (TMA) and triethyl aluminum (TEA) are mentioned, but there is no specific description of other organometallic compounds. This is because, since the chemical properties of the organometallic compounds generally vary greatly if the organic substituent attached to the metal element varies little, it is necessary to investigate individually to determine what organometallic compound should be used. In this method, not only is there the inconvenience that the naturally oxidized film must be removed, but also there is the problem that surface smoothness cannot be obtained.

In the pre-text of the 2nd Symposium of Electrochemical Society, Branch of Japan (July 7, 1989), on page 75, there is a description of film formation of Al according to the double wall CVD method. In this method, TIBA is used and the device is designed so that the gas temperature can be made higher than the substrate temperature. This method may be also regarded as a modification of the above-mentioned Japanese Laid-open Patent Application No. Sho-63-33569. Also in this method, Al can be selectively grown only on a metal or semiconductor. However, not only the difference between the gas temperature and the substrate surface temperature can be controlled with difficulty, but there is also the problem that the bomb and the pipeline must be heated. Moreover, according to this method, there are involved such problems that no uniform continuous film can be formed, that the flatness of the film is poor, that selectivity of Al selective growth cannot be maintained for so long a time, etc., unless the film is made thick to some extent.

Also, since TIBA has small vapor pressure at room temperature as 0.1 torr, it has the problem that it is transported in a large quantity with difficulty. For this reason, it has been the practice to heat the bomb for organometallic compound to 45° to 50° C., but there is the problem that not only the vessel for organometallic compound, but also the pipeline to the reaction vessel must be also heated.

Trimethyl aluminum (TMA) has a vapor pressure of approximately 10 torr at room temperature, and it is possible to transport TMA to a reaction vessel efficiently by flowing a gas such as $H_2$, etc. into the TMA starting material solution.

J. Electrochem. Soc. 135 (2) (1988) 455 discloses that deposition of Al is possible by use of TMA according to the plasma CVD method or the magnetron plasma CVD method.

However, in the magnetron CVD method, since even C—H bond of alkyl group is decomposed, there is the great problem that several % to several 10% of carbon atoms are incorporated in the deposited film. Also, there is the problem of occurrence of charged particle damaging by plasma.

Since the magnetron plasma CVD method is based on decomposition of TMA in the gas phase, it can be deposited on the substrate surface, whether it may be Si or $SiO_2$, whereby selective Al deposition is essentially impossible.

According to Japanese Patent Application No. Sho-60-211149, when TMA is used, Al deposition without incorporation of carbon is possible according to the reaction with heat or heat and UV-ray irradiation by use of excited and decomposed molecules, by exciting and decomposing TMA molecules with plasma in the gas phase apart from the wafer.

Similarly, Extended Abs. of 20th Solid State Devices and Materials (1988) p. 573 by the present inventors, there is shown deposition of an Al film without incorporation of carbon at a deposition rate of 10 to 20 Å/min. on Si or a thermally oxidized $SiO_2$ wafer heated to 260° C. to 350° C. by use of TMA and by exciting TMA with an $H_2$ atmosphere high frequency (73.56 MHz) plasma.

According to the method shown in Japanese Patent Application No. Sho-60-211149 and Extended Abstract of 20th Solid State Devices and Materials (1988) p. 573, although deposition example of Al thin film is shown, there is no reference to the method of depositing Al selectively only on the Si exposed portion on the Si wafer subjected to patterning of $SiO_2$. In Extended Abstract of 20th Solid State Devices and Materials (1988) p. 573, it is shown that Al is deposited at the similar extent of deposition rate on the thermally oxidized $SiO_2$ wafer and Si wafer.

SUMMARY OF THE INVENTION

As described above, in the technical field of higher integration it has been sought in recent years, to provide a semiconductor which is highly integrated and superior in performance, as well as other areas for improvement.

The present invention has been accomplished in view of the technical tasks as described above, and its object is to provide a deposited film formation method capable of forming an Al or Al-Si film having good quality as conductor with good controllability at a desired position.

An object of the present invention is to provide a deposited film formation method which forms an aluminum film by use of the plasma CVD method, wherein a substrate having an electron donative surface (A) and a non-electron donative surface (B) is arranged in a space for deposited film formation having a portion which is increased in cross-sectional area toward which said substrate is arranged, and a gas of trimethylaluminum and hydrogen gas are introduced into said space for deposited film formation to deposit an aluminum film selectively on said electron donative surface (A).

Another object of the present invention is to provide a deposited film formation method which forms an aluminum film by use of the plasma CVD method, comprising:

the step of arranging a substrate having an electron donative surface (A) and a non-electron donative surface (B) in a space for deposited film formation equipped with a reverse flow preventive means into plasma, and the step of introducing a gas of trimethylaluminum and hydrogen gas into said space for deposited film formation, said aluminum film being selectively formed on said electron donative surface (A).

DESCRIPTION OF THE PREFERRED EMBODIMENTS

Figure 1:
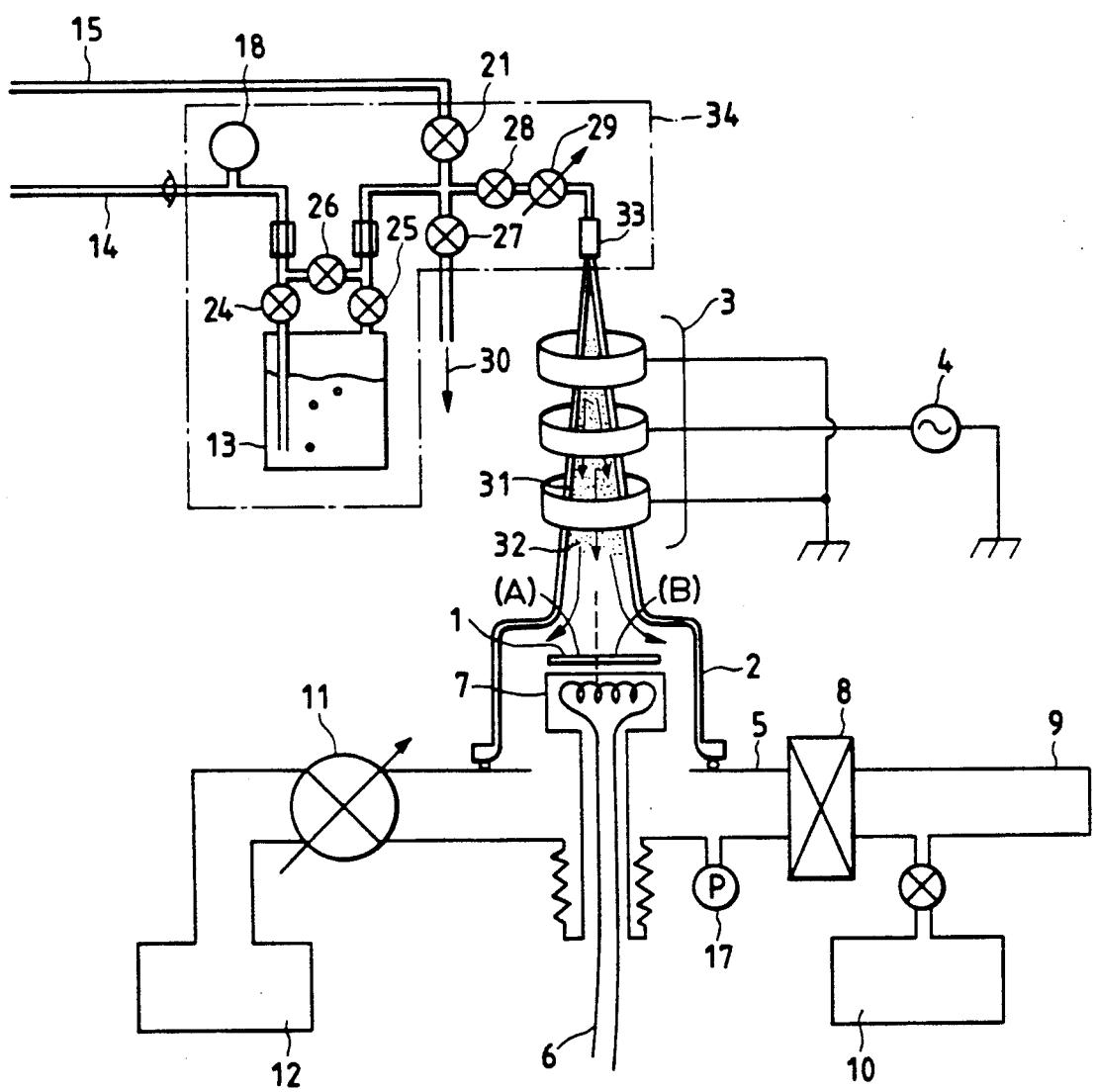
FIG. 1 is a schematic view showing the deposited film formation device according to an example of the present invention.

For accomplishing such object, the deposited film formation method of the present invention is a deposited film formation method which forms an aluminum film by use of the plasma CVD method, comprising:

(a) the step of arranging a substrate having an electron donative surface (A) and a non-electron donative surface (B) in a space for deposited film formation equipped with a reverse flow preventive means into plasma, and (b) the step of introducing a gas of trimethylaluminum and hydrogen gas into said space for deposited film formation, said aluminum film being selectively formed on said electron donative surface (A).

In the following, the deposited film formation method of the present invention is described in detail.

First, Al deposition by use of trimethylaluminum (TMA) is outlined. TMA is represented by the following formula:

TMA: $Al(CH_3)_3$

TMA has been said to have a dimer structure as shown below at room temperature:

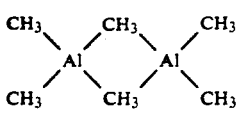

TMA, as an organometallic compound, is a material widely used in the field of chemical engineering as the catalyst material.

Generally speaking, the organometallic decomposition reaction depends greatly on the kind of metal atom, the kind of alkyl group bonded to the metal atom and the excitation and decomposition means, and therefore excitation and decomposition reaction must be specified for each individual material. As to TMA, as the reaction concerning the chemical vapor phase deposition method, the following points have been clarified.

Pyrolysis in the gas phase is a radical decomposition in which the Al—$CH_3$ bond is cleaved, and forms $CH_4$ at lower temperature of 150° C. or lower through the reaction with the atmospheric hydrogen, finally forming Al. However, at higher temperature of 300° C. or higher, even if hydrogen may exist in the atmosphere, $CH_3$ group will withdraw H from TMA, whereby finally an Al-C compound is formed.

In the region limited in power density to some extent in light or high frequency (13.56 MHz) plasma under $H_2$ atmosphere, $C_2H_6$ is formed through coupling of the bridging $CH_3$ between two Al's.

According to the magnetron plasma CVD method employing TMA, Al deposition has been attempted, but several to several ten % of carbon atoms will be incorporated in the deposited film, and also the resistivity of the deposited film becomes very large as 5- to 20-fold of the bulk value. Incorporation of carbon occurs because TMA is excessively decomposed. Besides, since the plasma or magnetron plasma CVD method is based on the reaction in gas phase, no selective growth or selective deposition can be rendered possible in principle.

By controlling the high frequency power to be applied, in the high frequency discharging $H_2$ plasma, TMA molecules will be excited and decomposed to

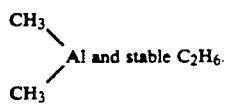

The state under which excitation and decomposition occur to $Al(CH_3)_2$ and stable molecular species is called the selective excitation state. When the excited molecular species such as $Al(CH_3)_2$, etc. selectively excited are transported onto a heated Si wafer, an Al film without incorporation of carbon is deposited. However, the gas stream is jumped against the wafer, whereby the excited molecular species cannot be transported to the wafer with good efficiency, or the molecules such as $C_2H_6$ which should be ordinarily discharged and $CH_4$ formed after Al deposition reaction will flow reversely into plasma. As the result, a selective excitation may be considered to be broken and cause unnecessary reaction for Al deposition reaction to occur. Therefore the deposition rate is small and even no selectivity effected depending on the kind of the subbing substrate may sometimes occur.

In the present invention, selective excitation and decomposition of TMA in the $H_2$ atmosphere is the same as in the prior art, but the excited molecular species formed in plasma are permitted to be transferred onto a wafer without occurrence of reverse flow caused by convection or eddy within the space for formation of deposited film (reaction tube), to have Al deposited on the wafer. Because the excited molecular species are transferred efficiently onto the wafer and no unnecessary reaction occurs, not only flatness is high and Al of high quality is deposited, but also selectivity of deposition depending on the subbing substrate is effected.

Referring now to the drawings, preferred embodiments of the present invention are described.

In the present invention, the CVD method is employed in order to deposit an Al or Al-Si film of good quality as the electroconductive deposited film selectively on a substrate.

More specifically, by use of trimethyl aluminum (TMA):

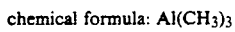

chemical formula: $Al(CH_3)_3$ which is an organometallic compound as the starting gas containing at least one atom which is the constituent of the deposited film and a gas containing Si atom as the starting gases, and also by use of $H_2$ as the reactive gas, an Al or Al-Si film is formed selectively on a substrate by gas phase growth by these mixed gases.

The substrate to which the present invention is applicable has a first substrate surface material for forming the surface on which Al or Al-Si is to be deposited, and a second substrate surface material for forming the surface on which no Al or Al-Si is deposited. And, as the first substrate surface material, a material having electron donative characteristic is employed.

The electron donative characteristic is described in detail below.

An electron donative material is one having free electrons existing in the substrate or having intentionally free electrons formed therein and, for example, may be a material having the surface where the chemical reaction is promoted by give-and-take of electrons with the starting gas molecules attached on the substrate surface. For example, generally metals and semiconductors correspond to this. Those having thin oxide films on metal or semiconductor surfaces are also included. This is because the chemical reaction occurs by give-and-take of electrons between the substrate and the attached starting material molecules.

Specifically, there may be included semiconductors such as single crystalline silicon, polycrystalline silicon, amorphous silicon, the binary system, ternary system or quarternary system III-V ground compound semiconductors comprising combinations of Ga, In, Al as the group III element and P, As, N as the group V element, metals, alloys and silicides thereof such as tungsten, molybdenum, tantalum, tungsten silicide, titanium silicide, aluminum, aluminumsilicon, titaniumaluminum, titanium nitride, copper, aluminumsiliconcopper, aluminumpalladium, titanium, molybdenum silicide, tantalum silicide, etc.

In contrast, as the material for forming the surface on which Al or Al-Si is not selectively deposited, namely the non-electron donative material, silicon oxide by thermal oxidation, CVD, etc., glass such as BSG, PSG, BPSG, etc. or oxide film, silicon nitride film by thermal CVD, plasma CVD, low pressure CVD, ECR-CVD, etc.

On the substrate with such a constitution, Al or Al-Si is deposited according to the following reaction in the reaction system of the starting gas and $H_2$:

First, $Al(CH_3)_2$ is formed in gas phase in a high frequency discharging plasma according to the following reaction:

$$Al_2(CH_3)_6 \rightarrow 2Al(CH_3)_2 + C_2H_6$$

$Al(CH_3)_2$ is transported onto a wafer, and Al is deposited according to the subsequent reaction. Also, deposition of Al-Si alloy by addition of $Si_2H_6$, etc. is effected by decomposition of $Si_2H_6$ reaching the substrate surface by the surface chemical reaction to be incorporated in the deposited film.

FIG. 1 is a schematic view showing a deposited film formation device to which the present invention is applicable.

In this example, the reverse flow preventive means is accomplished by determining adequately the shape of the reaction tube constituting the space for deposited film formation. That is, in this example, the reaction tube is made to have a shape with the cross-sectional area of the portion of the plasma generation region 32 being enlarged, for example, a horn shape (conical shape or pyramidal shape).

1 is a silicon wafer, which is set in the reaction tube 2 made of quartz having a horn shaped portion in Al deposition. A metal electrode 3 for high frequency plasma generation is mounted externally of the quartz reaction tube 2. For the metal electrode, the known three electrode system is employed, having an excitation electrode surrounded on both sides with earth electrodes. Between the excitation electrode and the earth electrodes, discharging occurs. Depending on presence or absence of the wafer holder, the shape of the plasma generation region will not be substantially changed. By use of the three electrode system, the plasma generation region 32 can be confined in the vicinity of the electrode. The plasma generation region is the portion shown by the dots. For plasma generation, a high frequency power source 4 with an oscillation frequency of approximately 13.56 MHz is employed. Since the electrical field is concentrated on the metal electrode by the three electrode structure, there occurs substantially no charged particle damage onto the substrate.

In the example in FIG. 1, by making the reaction tube shape a horn shape as shown in FIG. 1, the flux of the gas is transported without convection or eddy. In the viscous flow region where the pressure is from atmospheric pressure to approximately several 10 torr, there is the method of removing convection, etc. of the gas within the reaction tube by making the reaction tube shape horn shape, but in the device in FIG. 1, it is used in the medium flow region where the pressure is 0.1 to 10 torr. The optimum value of the opening angle of horn depends on the pressure, but within the pressure range from 0.5 to 2.0 torr, it may be 10° to 20°.

$H_2$ gas is followed from the pipeline 14 into the vessel 13 for organometallic compound to gasify the organometallic compound TMA, and the organometallic compound is led into the reaction vessel 2. From the pipeline 15, hydrogen for dilution and $Si_2H_6$ gas are flowed.

The roles of the valves 27 and 28 are as described below.

For the internal thorough purging of the pipelines 14 and 15, with the valve 28 is closed and the valve 27 opened, pipelines 14 and 15 are purged. In leading the starting gas into the reaction tube, the valve 28 is opened and the valve 27 closed.

The needle valve 29 is used for making the pressure on the inlet side of the TMA bomb approximately atmospheric. The opening of the needle valve 29 is controlled while watching the indication value of the pressure gauge 18.

The organometallic compound such as TMA, etc., when $H_2$ is present, will be decomposed with formation of $CH_4$ by the reaction of $CH_3$ groups with $H_2$ according to the catalytic reaction in gas phase and on the stainless steel pipeline surface, etc.

Particularly, before film formation, if the stainless steel pipeline portion through which TMA flows is treated with baking treatment to liberate the adsorbed moisture on the stainless steel surface, the stainless steel surface will be activated and thereafter TMA molecules will be more readily adsorbed thereon, whereby decomposition of TMA molecules through the catalyst reaction on the stainless steel surface can proceed with ease. Therefore, if the stainless steel pipeline from the TMA vessel to the reaction tube is unnecessarily long, TMA molecules will be decomposed in the course to the reaction tube, and particularly if pure TMA molecules do not reach the reaction tube at the initial stage of film formation, it is difficult to form an Al film with excellent flatness.

Accordingly, it is desirable to arrange the TMA bomb immediately near the reaction tube. Also, the region encircled with the chained dot line around the TMA bomb should be desirably made integrated.

As shown in Examples, by use of the organometallic compound vessel equipped with a by-pass valve, and an integrated structural pipeline around bomb by the present inventors, the time of maintaining selectivity is elongated.

In the device shown in FIG. 1, when TMA is introduced into the reaction tube 2 under the state where plasma is generated, Al or Al-Si is selectively deposited on the electron donative substrate.

Deposition of Al will vary depending on the atmospheric gas, the reaction tube pressure, the substrate temperature.

For the atmospheric gas, $H_2$ is used.

The reaction mode of the decomposition reaction of organometallic compound generally differs depending on the kind of the metal atom, the kind and the number of the alkyl group bonded to the metal atom, but when Al is deposited from TMA, hydrogen gas ($H_2$) is required as the reaction gas.

When there is enough hydrogen, an inert gas such as Ar, etc. may be mixed therein.

The reaction tube pressure may be 0.1 to 10 torr for deposition of Al, desirably 0.5 to 1.5 torr.

The plasma application power is very sensitive, and in the case of the present device, at a power density of 0.02 W/cm$^3$, no Al will be deposited at a substrate temperature range from 180° to 350° C.

On the other hand, at a power density of 0.18 W/cm$^3$ or higher, C will be incorporated into the deposited film, and therefore the power density should be desirably 0.03 to 0.06 W/cm$^3$.

The power density is a value of the power required for plasma generation divided by the plasma generation volume.

When the plasma power density is 0.03 to 0.06 W/cm$^3$, Al will be selectively deposited only on the electron donative surface at a substrate temperature range from 180° to 350° C.

When deposition is effected under constant deposition conditions of the whole pressure, the plasma power, TMA transportation amount, etc. other than the substrate temperature, Al will be deposited at a deposition rate according to the surface controlling process along the Arrhenius plot in the range from 180° to 350° C.

The Al or Al-Si film deposited selectively according to the present invention is found to be an Al film of high quality which is continuous and flat and also has a resistivity substantially equal to the bulk value of 2.7 $\mu\Omega$·cm, even if it may be a film of 400 Å or less.

Accordingly, even by the heat treatment of 450° C. for one hour, there is no generation of hillock, and also there is generation at the contact portion with Si.

TMA has a great vapor pressure of 10 torr at room temperature, and can be easily transported in larger amount as compared with TIBE (having vapor pressure at room temperature of 0.1 torr) of which selective CVD has been attempted in the prior art, and therefore easily deposited on a large number sheets of wafer, whereby the selective Al CVD method can be applied easily to the ultra-LSI process.

Figure 2:
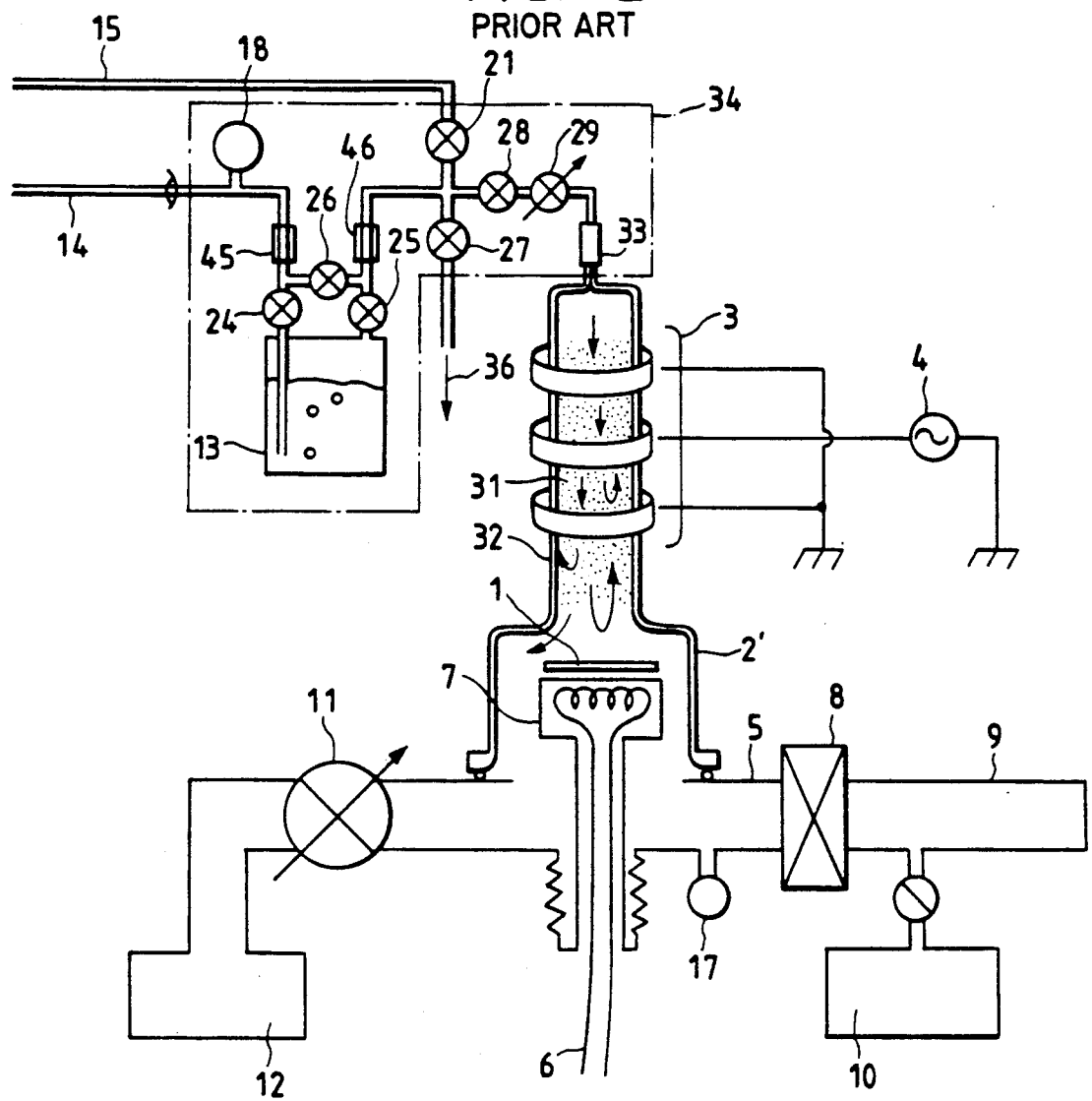
FIG. 2 a schematic view showing a comparative example to the device.

In contrast, with the constitution as shown in FIG. 2 equipped with no eddy preventive means as in the present example, namely the constitution by use of the reaction tube 2' having a portion of straight tubular shape and a wafer arranged vertically to the axis line, the gas stream will be jumped up at the wafer 1, whereby the excited molecular species cannot be efficiently transported to the wafer, or the deposition rate is small as 10 to 20 Å/min., probably because the molecules such as $C_2H_6$ which should be normally discharged or $CH_4$ formed after Al deposition reaction flow reversely within the reaction tube 2' to break the selective excited state to give rise to unnecessary reactions for Al deposition reaction, and also no selectivity depending on the subbing substrate has appeared.

EXAMPLE 1

The Al deposition procedure is as described below. By means of the device shown in FIG. 1, the reaction tube 2 is internally evacuated to ca. 10$^{-8}$ Torr by an evacuation equipment 12. However, Al can be deposited even if the vacuum degree in the reaction tube 2 may be higher than 1×10$^{-8}$ Torr.

After washing of the Si wafer, the conveying chamber 9 is opened to atmospheric pressure and the Si wafer is mounted in the conveying chamber 9. The conveying chamber 9 is evacuated to ca. 1×10$^{-6}$ Torr by use of an evacuation equipment 10, and then the gate valve 8 is opened and the wafer is mounted on the wafer holder 7.

In this Example, hydrogen gas is flowed through the pipelines 14 and 15. With the valve 28 being closed and the valve 27 opened, the pipelines are sufficiently purged internally. Also, prior to Al deposition, for purging internally the TMA bomb, with the valve 26 being closed, the valve 24 and the valve 25 opened, the TMA bomb is internally purged. In purging the TMA bomb, the valve 27 is opened to effect evacuation together with hydrogen carrier gas. After purging, introduction of carrier gas into the TMA bomb is once stopped.

Hydrogen gas is flowed through the pipelines 14 and 15 into the reaction tube, and the pressure in the reaction tube 2 is adjusted to a predetermined value by controlling the opening of the slow leak valve 11.

A typical pressure in this Example is 0.7 Torr. Then, the wafer is heated by current passage through the heater 6. After the wafer temperature has reached a predetermined temperature, a predetermined power is applied from the plasma generation power source 4 to generate a plasma within the reaction tube 2. The generation frequency of the plasma is 13.56 MHz. After generation of the plasma, hydrogen gas from the pipeline 14 is introduced into the TMA vessel to initiate transportation of TMA. Simultaneously with initiation of transportation of TMA, Al is deposited. After elapse of a predetermined deposition time, transportation of TMA is stopped, and also generation of the plasma is stopped. Current passage to the heater 6 is stopped and the wafer cooled. Feeding of hydrogen gas into the reaction tube 2 is stopped, and after evacuation internally of the reaction tube 2, the wafer is conveyed to the conveying chamber, and only the conveying chamber is opened to atmospheric to take out the wafer. The outline of the Al deposition procedure is as described above.

For the vessel of organometallic compound used in this Example, one provided with two of the valve 24 for inflow of the carrier gas and the valve 25 for outflow is employed.

In the following, the sample preparation in this Example is to be described.

An Si substrate (N type 1−2Ω·cm) is thermally oxidized at a temperature of 1000° C. according to the hydrogen combustion system (H$_2$: 4 liter/M, O$_2$: 2 liter/M).

The film thickness is 7000 Å±500 Å, and the refractive index 1.46. On the whole Si substrate surface is coated a photoresist, followed by printing of a desired pattern by an exposure machine. The pattern is such that various pores of 0.25 $\mu$m×0.25 $\mu$m − 100 $\mu$m×100 $\mu$m are opened. The photoresist is developed and then etched with reactive ion etching (RIE), etc. to etch the subbing SiO$_2$, thereby having partially the substrate Si exposed. Thus, samples having pores of SiO$_2$ with various sizes of 0.25 $\mu$m×0.25 $\mu$m − 100 $\mu$m×100 $\mu$m are prepared.

The substrate temperature is set at 10 levels, and the plasma power source at 6 levels, and for the respective 60 combinations of them, deposition is carried out each for 10 sheets of samples according to the procedure as described above.

The deposition conditions are as follows:
Total pressure: 0.7 Torr
TMA partial pressure: 1.5×10$^{-4}$ Torr The evaluation results of Al films deposited are shown in Table 1.

TABLE 1

| Plasma power density (W/cm³) | Substrate temperature (°C.) | | | | | | | | | |
|---|---|---|---|---|---|---|---|---|---|---|
| | 170 | 180 | 200 | 225 | 250 | 275 | 300 | 325 | 350 | 370 |
| 0.02 | ↑ | ←――――――――― Not deposited ―――――――――→ | | | | | | | | ↑ |
| 0.03 | | ←―――――― D.R = 10～500Å/minute ――――――→ | | | | | | | | |
| | | ←―――― R = 85-95% ――――→←― R = 75-85% ―→ | | | | | | | | |
| 0.045 | | ←―――――― D.R = 70～1500Å/minute ―――――→ | | | | | | | | |
| | | ←―――― R = 85-95% ――――→←― R = 75-85% ―→ | | | | | | | | |
| 0.06 | Not deposited | ←―――――― D.R = 70～1500Å/minute ―――――→ | | | | | | | | Carbon incorporated in (several %) Deposition rate 20Å/min or less |
| | | ←―――― R = 85-95% ――――→←― R = 70-80% ―→ | | | | | | | | |
| 0.1 | | ←――( D.R = 70～1500Å/minute / Carbon incorporated = 0.01～0.5% )――→ | | | | | | | | |
| 0.18 | ↓ | ←――――― Carbon incorporated (several %～30%) ―――――→ | | | | | | | | ↓ |

D.R: Deposition rate
R: Reflectance

At a substrate temperature of 170° C. or lower, or at a plasma power of 0.02 W/cm³ or lower, no deposition occurs on both Si and SiO₂ even by deposition for 2 hours.

During plasma power application of 0.18 W/cm³, deposition of the film occurs, but there is incorporation of carbon therein.

At a substrate temperature of 370° C. or higher, the deposition rate is extremely reduced, whereby carbon is incorporated into the deposited film.

Al is deposited under the conditions of a substrate temperature of 180° C.—350° C. and a plasma power of 0.03—0.06 W/cm³.

The Al films deposited are all found to have a film thickness of 400 Å, being continuous and flat, and resistivities similar to the bulk as 2.7—3.0 $\mu\Omega$·cm. And even if at the film thichness of 1 $\mu$m, the resistivity was 2.7 to 3.0 $\mu\Omega$·cm. By Auger's analysis, photoelectron spectrophotometry, no incorporation of C is detected. However, at a substrate temperature of 300° C. or higher, with a film thickness of 1000 Å or higher, reflectance is slightly lowered and flatness lowered.

Al deposition under the conditions of a substrate temperature of 180° C.—350° C. and a plasma power of 0.03—0.06 W/cm³, occurs only at the Si exposed portion, without deposition on SiO₂ (selectivity of deposition is maintained for 1 hour). When the plasma power is made constant at 0.03, 0.045, 0.06 W/cm³, respectively, the deposition rate D.R. when the substrate temperature is 180°—350° C. is represented by:

$$D.R. = D_0 \exp(-E/kT)$$

$D_0$ = constant value
E = activation energy
k = Boltzmann's constant
T = substrate temperature.

The activation energy E is a value of 1—2 eV.

EXAMPLE 2

According to the same procedure as in Example 1, Al was deposited under the following conditions.

The deposition conditions were made a reaction tube pressure of 0.7 Torr, a substrate temperature of 270° C., a plasma generation power density of 0.045 W/cm³, with the TMA partial pressure being varied from $5 \times 10^{-6}$ Torr to $1.5 \times 10^{-3}$ Torr. The deposition rate was varied from 10 Å/min. to 4000 Å/min. in proportion to TMA partial pressure. Regardless of TMA pressure, Al was deposited only on the exposed surface of Si similarly as in Example 1.

EXAMPLE 3

According to the same procedure as in Example 1, Al deposition was carried out under the following conditions.

The deposition conditions were made a substrate temperature of 270° C., a plasma generation power density of 0.045 W/cm³, a TMA partial pressure of $1.5 \times 10^{-4}$ Torr, with the reaction tube pressure being varied from 0.1 Torr to 3 Torr.

When the reaction tube pressure was ca. 0.5 to 1.5 Torr, Al was deposited only on the Si exposed portion similarly as in Example 1 at a deposition rate of ca. 200 to 400 Å/min. As a reaction tube pressure of ca. 0.3 Torr or less, no deposition occured on both the Si exposed portion and the SiO₂ portion even by deposition for 2 hours. At a pressure of ca. 1.5 Torr, deposition occurred only on the Si exposed portion, but the deposition rate was reduced to 100 to 200 Å/min.

EXAMPLE 4

According to the same procedure as in Example 1, Al films were formed on the substrates with the constitutions as described below (Samples 5-1 to 5-179).

PREPARATION OF SAMPLE 5-1

On a single crystalline silicon as the first substrate surface material which was electron donative, a thermally oxidized SiO₂ film as the second substrate surface material which was non-electron donative was formed, followed by patterning according to the photolithographic steps as shown in Example 1, to have the single crystalline silicon surface partially exposed.

The film thickness of the thermally oxidized SiO₂ film was found to be 7000 Å, and the size of the exposed portion, namely the opening of the single crystalline silicon 3 $\mu$m × 3 $\mu$m. Thus, Sample 5-1 was prepared. (hereinafter such sample is represented as "thermally oxidized SiO₂ (hereinafter abbreviated as T-SiO₂)/single crystalline silicon").

PREPARATION OF SAMPLES 5-2 to 5-179

Sample 5-2 was an oxidized film formed by normal pressure CVD (hereinafter abbreviated as SiO₂)/single crystalline silicon;

Sample 5-3 was a boron doped oxidized film formed by normal pressure CVD (hereinafter abbreviated as BSG)/single crystalline silicon;

Sample 5-4 was a phosphorus doped oxidized film formed by normal pressure CVD (hereinafter abbreviated as PSG)/single crystalline silicon;

Sample 5-5 was a phosphorus and boron doped oxidized film formed by normal pressure CVD (hereinafter abbreviated as BSPG)/single crystalline silicon;

Sample 5-6 was a nitrified film formed by plasma CVD (hereinafter abbreviated as P-S:N)/single crystalline silicon;

Sample 5-7 was a thermally nitrified film (hereinafter abbreviated as T-S:N)/single silicon;

Sample 5-8 was a nitrified film formed by low pressure DCVD (hereinafter abbreviated as LP-S:N)/single crystalline silicon;

Sample 5-9 was a nitrified film formed by ECR device (hereinafter abbreviated as ECR-SiN)/single crystalline silicon. Further, according to combinations of the first substrate surface material which was electron donative and the second substrate surface material which was non-electron donative, Samples 5-11–5-179 shown in Table 2 were prepared. As the first substrate surface material were employed single crystalline silicon (single crystalline Si), polycrystalline silicon (polycrystalline Si), amorphous silicon (amorphous Si), tungsten (W), molybdenum (Mo), tantalum (Ta), tungsten silicide (WSi), titanium silicide (TiSi), aluminum (Al), aluminumsilicon (Al-Si), titaniumaluminum (Al-Ti), titanium nitride (Ti-N), copper (Cu), aluminumsilicon-copper (Al-Si-Cu), aluminumpalladium (Al-Pd), titanium (Ti), molybdenum silicide (Mo-Si), tantalum silicide (Ta-Si). By use of these samples and Al₂O₃ substrate, SiO₂ glass, Al was deposited under deposition conditions:

Reaction tube pressure: 0.7 Torr
TMA partial pressure: 1.5×10⁻⁴ Torr
Plasma generation power density: 0.045 W/cm³
Deposition time: 20 minutes.

The film forming conditions are a reaction tube pressure of 0.3 Torr, a DMAH partial pressure of 3.0×10⁻⁵ Torr, a substrate temperature of 300° C. and a film formation time of 10 minutes.

TABLE 2

| Non-electron donative | Electron donative | | | | | | | | |
|---|---|---|---|---|---|---|---|---|---|
| | Single crystalline Si | Poly-crystalline Si | Amorphous Si | W | Mo | Ta | WSi | TiSi | Al |
| T—SiO₂ | 5-1 | 5-11 | 5-21 | 5-31 | 5-41 | 5-51 | 5-61 | 5-71 | 5-81 |
| SiO₂ | 5-2 | 5-12 | 5-22 | 5-32 | 5-42 | 5-52 | 5-62 | 5-72 | 5-82 |
| BSG | 5-3 | 5-13 | 5-23 | 5-33 | 5-43 | 5-53 | 5-63 | 5-73 | 5-83 |
| PSG | 5-4 | 5-14 | 5-24 | 5-34 | 5-44 | 5-54 | 5-64 | 5-74 | 5-84 |
| BPSG | 5-5 | 5-15 | 5-25 | 5-35 | 5-45 | 5-55 | 5-65 | 5-75 | 5-85 |
| P—SiN | 5-6 | 5-16 | 5-26 | 5-36 | 5-46 | 5-56 | 5-66 | 5-76 | 5-86 |
| T—SiN | 5-7 | 5-17 | 5-27 | 5-37 | 5-47 | 5-57 | 5-67 | 5-77 | 5-87 |
| LP—SiN | 5-8 | 5-18 | 5-28 | 5-38 | 5-48 | 5-58 | 5-68 | 5-78 | 5-88 |
| ECR—SiN | 5-9 | 5-19 | 5-29 | 5-39 | 5-49 | 5-59 | 5-69 | 5-79 | 5-89 |

| Non-electron donative | Electron donative | | | | | | | | |
|---|---|---|---|---|---|---|---|---|---|
| | AlSi | AlTi | Ti—N | Cu | Al—Si—Cu | AlPd | Ti | Mo—Si | Ta—Si |
| T—SiO₂ | 5-91 | 5-101 | 5-111 | 5-121 | 5-131 | 5-141 | 5-151 | 5-161 | 5-171 |
| SiO₂ | 5-92 | 5-102 | 5-112 | 5-122 | 5-132 | 5-142 | 5-152 | 5-162 | 5-172 |
| BSG | 5-93 | 5-103 | 5-113 | 5-123 | 5-133 | 5-143 | 5-153 | 5-163 | 5-173 |
| PSG | 5-94 | 5-104 | 5-114 | 5-124 | 5-134 | 5-144 | 5-154 | 5-164 | 5-174 |
| BPSG | 5-95 | 5-105 | 5-115 | 5-125 | 5-135 | 5-145 | 5-155 | 5-165 | 5-175 |
| P—SiN | 5-96 | 5-106 | 5-116 | 5-126 | 5-136 | 5-146 | 5-156 | S-166 | 5-176 |
| T—SiN | 5-97 | 5-107 | 5-117 | 5-127 | 5-137 | 5-147 | 4-157 | 5-167 | 5-177 |
| LP—SiN | 5-98 | 5-108 | 5-118 | 5-128 | 5-138 | 5-148 | 5-158 | 5-168 | 5-178 |
| ECR—SiN | 5-99 | 5-109 | 5-119 | 5-129 | 5-139 | 5-149 | 5-159 | 5-169 | 5-179 |

(Note)
Numeral indicates Sample No.

As the result of film formation under such conditions, concerning all the samples applied with patterning from Samples 5-1 to 5-179, deposition of Al film occurred only on the first substrate surface which was electron donative to embed completely the opening with a depth of 7000 Å. The film quality of Al film exhibited the same properties as one deposited under the same conditions as shown in Example 1, having both good resistivity and reflectance. On the other hand, no Al film was deposited at all on the second substrate surface which was non-electron donating. Also, on Al₂O₃ substrate and SiO₂ glass substrate which was non-electron donative, no Al film was deposited at all.

EXAMPLE 5

On an Si wafer having a part of Si exposed by patterning of an SiO₂ film Al was deposited under the following conditions. The Si wafter was prepared according to the same procedure as in Example 1.

First, after deposition of Al under the deposition conditions (1), Al was subsequently deposited under the deposition conditions (2).

The deposition conditions (1) were as follows:
reaction tube temperature: 0.7 Torr
TMA partial pressure: 1.5×10⁻⁴ Torr
plasma generation power density: 0.045 W/cm³
substrate temperature: 220° C. or 250° C.

The deposition conditions when the substrate temperature was 220° C. were called the deposition conditions (1a), and those when the substrate temperature 250° C. the deposition conditions (2a).

The deposition conditions (2) were as follows:
reaction tube temperature: 0.7 Torr TMA partial pressure: $1.5 \times 10^{-4}$ Torr or $1.5 \times 10^{-3}$ Torr
plasma generation power density: 0.045 W/cm$^3$
substrate temperature: 300° C. or 350° C.

The deposition conditions when the TMA partial pressure was $1.5 \times 10^{-4}$ Torr, the substrate temperature 300° C. were called the deposition conditions (2a), those when the TMA partial pressure $1.5 \times 10^{-4}$ Torr and the substrate temperature 350° C., the deposition conditions (2b), those when the TMA partial pressure $1.5 \times 10^{-3}$ Torr and the substrate temperature 300° C., the deposition conditions (2c), and those when the TMA partial pressure $1.5 \times 10^{-3}$ Torr and the substrate temperature 350° C., the deposition conditions (2d).

According to the eight combinations of the deposition conditions (1a), (1b) and the deposition condition of (2d), Al films were deposited to 7000 Å.

In all the conditions, Al was deposited only on the Si exposed portion. All the samples had resistivities similar to the bulk as 2.7 to 3.0 μΩ·cm. In Example, when the deposition temperature was 300° C. or higher, the reflectance was deteriorated, but in this Example when deposition was effected subsequently to the deposition conditions (1a) or (1b), the reflectance was good as 85 to 95%, with surface flatness being also very good. Also, when deposition was effected under the deposition conditions (2d), the deposition rate was very great as ca. 0.7 to 1.0 μm/min.

EXAMPLE 6

Deposition was carried out according to the same procedure as in Example 1 under the following conditions:
reaction tube pressure: 0.7 Torr
TMA partial pressure: $1.5 \times 10^{-4}$ Torr
plasma generation power density: 0.045 W/cm$^3$
substrate temperature: 270° C.

In transporting TMA to the reaction tube, H$_2$ gas containing Si$_2$H$_6$ was transported into the reaction tube from the pipeline (2) 15 in FIG. 1. Deposition was carried out by varying Si$_2$H$_6$ partial pressure from $1.5 \times 10^{-6}$ Torr to $1.5 \times 10^{-5}$ Torr. An Al-Si film containing Si having the same properties as Al under the same substrate temperature, the TMA partial pressure, the plasma generation power as in Example 1 could be deposited only on the exposed portion of Si. The Si amount in the deposited film was proportional to the Si$_2$H$_6$ pressure, and varied from 0.25% to 2.5% under the above conditions.

EXAMPLE 7

The organometallic vessel used in Example 1 is provided with only the inflow valve 24 and the outflow valve 25 of the carrier gas. By use of the organometallic vessel equipped with a bypass valve according to the present inventors, and also by use of the device in FIG. 1 with the distance from the carrier gas valve 25 mounted on the organometallic vessel to the connector 33 at the upper portion of the reactor being made approximately 50 cm or less, the same experiment as in Example 1 was carried out. The same Al film as in Table 1 was deposited only on the Si exposed surface. Further, in Example 1, the time when selectivity was maintained was approximately one hour, but in this Example, the time when selectivity was maintained was elongated to about 2 hours. That is, due to the reduced dead zone in the pipelines, alkanes or TMA molecules decomposed not completely were reduced, whereby the ideal reaction could be maintained for a long time.

The constitution of the reverse flow presention means for ensuring the selective excitation state can be determined suitably without being limited to the above Examples.

Figure 3:
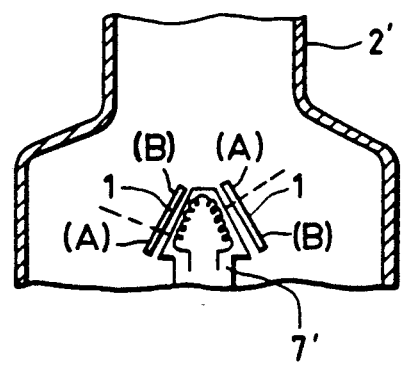
FIG. 3 is a schematic view showing the principal portion of the deposited film formation device according to another example of the present invention.

For example, as shown in FIG. 3, even if the reaction tube may have a straight tube shape similarly as in FIG. 2, by provision of a holder 7' which is arranged with the wafer 1 being slanted, a flow having components slanted relative to the axis line can be obtained, whereby reverse flow into the plasma caused by generation of convection or eddy will occur with difficulty and good selective deposition state can be obtained. Of course, the combination of the slanted arrangement of the substrate as shown in FIG. 3 and the horn shape in FIG. 1 was also extremely good.

We claim:

1. A deposited film formation method for forming an aluminum-containing film on a substrate in a deposition space comprising:
   (a) introducing a starting gas of trimethyl aluminum and hydrogen into a reaction zone having a portion which is increased in cross-sectional area from the gas-introducing side in a direction toward the substrate to prevent reverse gas flow;
   (b) generating a chemical vapor plasma of said starting gas in the reaction zone between the starting gas introduction side and the substrate; and
   (c) conducting the deposition of said film at an elevated substrate temperature and on a surface of the substrate having an electron donative portion (A) and a non-electron donative portion (B) to provide selective growth of said aluminum-containing film.

2. A deposited film formation method according to claim 1 wherein said gases are introduced into said deposition space through a region including said portion increased in cross-sectional area.

3. A deposited film formation method according to claim 1, wherein said portion increased in cross-sectional area is a horn-shaped portion provided as opposed to said substrate.

4. A deposited film formation method according to claim 1, wherein the material of the electron donative surface (A) is selected from single crystalline silicon, polycrystalline silicon, amorphous silicon, tungsten, molybdenum, tantalum, tungsten silicide, titanium silicide, aluminum, aluminumsilicon, titaniumaluminum, titanium nitride, copper, aluminumsiliconcopper, aluminumpalladium, titanium, molybdenum silicide, tantalum silicide.

5. A deposited film formation method according to claim 1, wherein the material of the non-electron donative surface (B) is selected from SiO$_2$, Al$_2$O$_3$, SiN, silicon oxide doped with boron or phosphorus.

6. A deposited film formation method according to claim 1, wherein said substrate is arranged as slanted relative to the axis line.

7. A deposited film formation method according to claim 1 wherein said aluminum-containing film is a film of aluminum or aluminum-silicon.

8. A deposited film formation method according to claim 3, wherein said horn shape is a conical shape or a pyramidal shape.

9. A deposited film formation method according to claim 3, wherein the opening angle at said horn-shaped portion is 10° to 20°.

10. A deposited film formation method according to claim 1 including generating the chemical vapor plasma at a plasma power density of 0.03 to 0.06 W/cm$^3$.

11. A deposited film formation method according to claim 1 including maintaining the substrate at a temperature from 180° to 350° C.

12. A deposited film formation method for forming an aluminum-containing film on a substrate in a deposition space comprising:
(a) generating a chemical vapor plasma of a starting gas of trimethylaluminum and hydrogen in a reaction zone between the starting gas introducing side and the substrate side;
(b) preventing a reverse flow of said plasma by a member for slanting said substrate relative to the plasma flow; and
(c) conducting the deposition of said film at an elevated substrate temperature on a surface of the substrate having an electron-donative portion (A) and a non-electron donative portion (B) to provide selective growth of said aluminum-containing film.

13. A deposited film formation method according to claim 12 wherein said reverse flow is further prevented by a portion of the reaction tube for constituting said space and has a shape enlarged in cross-sectional area in the generation region of said plasma.

14. A deposited film formation method according to claim 12, wherein said aluminum-containing film is a film of aluminum or aluminum-silicon.

15. A deposited film formation method according to claim 12, wherein the material of the electron donative surface (A) is selected from single crystalline silicon, polycrystalline silicon, amorphous silicon, tungsten, molybdenum, tantalum, tungsten silicide, titanium silicide, aluminum, aluminumsilicon, titaniumaluminum, titanium nitride, copper, aluminumsiliconcopper , aluminumpalladium, titanium, molybdenum silicide, tantalum silicide.

16. A deposited film formation method according to claim 12 wherein the material of the non-electron donative surface (B) is selected from SiO$_2$, Al$_2$O$_3$, SiN, silicon oxide doped with boron or phosphorus.

17. A diposited film formation method according to claim 12 including generating the chemical vapor plasma at a plasma power density of 0.03 to 0.06 W/cm$^3$.

18. A deposited film formation method according to claim 12 including maintaining the substrate at a temperature from 180° to 350° C.

19. A deposited film formation method according to claim 13, wherein the opening angle at said portion enlarged in cross-sectional area is 10° to 20°.

* * * * *

UNITED STATES PATENT AND TRADEMARK OFFICE
CERTIFICATE OF CORRECTION

PATENT NO. : 5,091,210

DATED : February 25, 1992

INVENTOR(S) : NOBUO MIKOSHIBA ET AL.      Page 1 of 2

It is certified that error appears in the above-identified patent and that said Letters Patent is hereby corrected as shown below:

Title Page:

AT [30] FOREIGN APPLICATION PRIORITY DATA

Insert, --[30] Foreign Application Priority Data
Sep. 26, 1989 [JP] Japan.....1-250028--.

AT [57] ABSTRACT

LIne 16, "surface (a)" should read --surface (A)--.

COLUMN 2

Line 17, "(so called" should read --(so-called--.

COLUMN 4

Line 55, "to" should read --of--.

COLUMN 6

Line 8, "the result, a" should read --a result, the--.
Line 68, "quarternary" should read --quaternary-- and "ground" should read --group--.

COLUMN 8

Line 5, "followed" should read --flowed--.
Line 48, "by-pass" should read --bypass--.
Line 49, "bomb" should read --the bomb--.

UNITED STATES PATENT AND TRADEMARK OFFICE
CERTIFICATE OF CORRECTION

PATENT NO. : 5,091,210
DATED : February 25, 1992
INVENTOR(S) : NOBUO MIKOSHIBA ET AL.

It is certified that error appears in the above-identified patent and that said Letters Patent is hereby corrected as shown below:

COLUMN 11

Table 1, "D.R = 70~1500Å/minute" (first occurrence) should read --D.R = 15~800Å/minute--.
Line 40, "thichness" should read --thickness--.

COLUMN 12

Line 44, "As" should read --At--.
Line 45, "occured" should read --occurred--.

COLUMN 18

Line 17, "diposited" should read --deposited--.

Signed and Sealed this

Twentieth Day of September, 1994

Attest:

BRUCE LEHMAN

Attesting Officer     Commissioner of Patents and Trademarks